United States Patent
Ozawa

(10) Patent No.: US 6,885,607 B2
(45) Date of Patent: Apr. 26, 2005

(54) SEMICONDUCTOR DEVICE HAVING SECURITY TECHNOLOGY

(75) Inventor: Kazumasa Ozawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 23 days.

(21) Appl. No.: 10/668,961

(22) Filed: Sep. 24, 2003

(65) Prior Publication Data

US 2004/0184339 A1 Sep. 23, 2004

(30) Foreign Application Priority Data

Mar. 20, 2003 (JP) ........................................ 2003-076871

(51) Int. Cl.$^7$ ................................................ G11C 8/00
(52) U.S. Cl. ............................ 365/230.03; 365/230.06; 365/230.08; 365/185.04
(58) Field of Search ....................... 365/230.03, 230.06, 365/230.08, 185.04

(56) References Cited

U.S. PATENT DOCUMENTS

| | | | | |
|---|---|---|---|---|
| 5,867,717 A | * | 2/1999 | Milhaupt et al. | ............ 713/323 |
| 6,016,273 A | * | 1/2000 | Seki et al. | ............. 365/185.22 |
| 6,421,754 B1 | * | 7/2002 | Kau et al. | .................... 710/261 |
| 6,651,149 B1 | * | 11/2003 | Iwasaki | ....................... 711/163 |
| 6,757,201 B1 | * | 6/2004 | Matsuda et al. | ........ 365/189.06 |
| 2002/0018380 A1 | | 2/2002 | Shinmori | |

FOREIGN PATENT DOCUMENTS

| | | |
|---|---|---|
| JP | 01-232452 | 9/1989 |
| JP | 2001-14871 | 1/2001 |
| JP | 2002-32267 | 1/2001 |
| JP | 2002-007372 | 1/2002 |

OTHER PUBLICATIONS

Apr. 15, 2004 Office Action for JP Application No. 2003-076871.

* cited by examiner

*Primary Examiner*—Michael S. Lebentritt
*Assistant Examiner*—Tuan T. Nguyen
(74) *Attorney, Agent, or Firm*—Nixon Peabody LLP; Donald R. Studebaker

(57) ABSTRACT

Predetermined programs and data are written into a first flash memory. The first flash memory is divided into a plurality of blocks. Security information for the respective blocks of the first flash memory is written into a second flash memory. The security information indicates whether or not reading of the stored data to the outside from the respective blocks of the first flash memory is prohibited. When a read target address signal is output by a CPU, the corresponding read data is read from the first flash memory and supplied to the CPU and a tri-state buffer. As a result, the CPU is able to obtain desired input data. A security signal from the second flash memory is supplied to the control terminal of the tri-state buffer. Accordingly, if reading of data to the outside is prohibited, the read data is not transmitted to the outside.

13 Claims, 4 Drawing Sheets

SEMICONDUCTOR DEVICE HAVING SECURITY TECHNOLOGY

BACKGROUND OF THE INVENTION

1. Field of the Invention

The present invention relates to security technology for a semiconductor device having a flash memory.

2. Description of the Related Art

FIG. 2 of the accompanying drawings illustrates a conventional nonvolatile semiconductor storage device disclosed in Japanese Patent Kokai (Laid-Open Publication) No. 2001-14871.

This nonvolatile semiconductor storage device 9 includes a flash memory main body 1, an information storage circuit 2, a command interface 3, a state machine 4, a data control circuit 5, a read circuit 6 and a tri-state buffer 7.

The flash memory main body 1 has three storage areas (blocks) for storing data, namely blocks (BLK) 1a, 1b, and 1c. The information storage circuit 2 includes three protect cells 2a to 2c for storing rewrite prohibition information for the blocks 1a to 1c, respectively. The information storage circuit 2 also includes a security cell 2d for storing read prohibition information. The command interface 3 determines reading, writing or erasing of data from, to or in the flash memory main body 1 and controls the state machine 4, on the basis of various control signals supplied from the outside.

When cancellation of the security function is instructed, the state machine 4 checks the protect cells 2a to 2c in the information storage circuit 2 to determine if the cells have been set to a rewrite prohibition state. If the cells are in the rewrite prohibition state, the state machine 4 disregards the protect setting to erase the data held in all of the blocks 1a to 1c in the flash memory main body 1.

The outputs of the blocks 1a to 1c of the flash memory main body 1 are connected to the tri-state buffer 7 via the read circuit 6. The data control circuit 5 controls the data output from the tri-state buffer 7 on the basis of control signals supplied from the outside and the contents (data) of the security cell 2d of the information storage circuit 2.

With this nonvolatile semiconductor storage device 9, it should be assumed now that the protection is set for all of the blocks 1a to 1c in the flash memory main body 1 by means of the protect cells 2a to 2c in the information storage circuit 2 in order to prevent the destruction of stored data by erroneous writing. Then, it should be assumed that the command interface 3 is instructed to cancel the security function.

When the cancellation instructions are sent to the state machine 4, the state machine 4 disregards the setting of the protection in the information storage circuit 2 and deletes the data held in all of the blocks 1a to 1c in the flash memory main body 1. Thus, even if a third party knows a method for canceling the security function, the third party cannot see or obtain the stored data, and therefore the third party is unable to read, decipher or falsify the stored data.

When accessing a block for which rewriting and reading are prohibited, however, the data of all the blocks 1a to 1c in the flash memory main body 1 is always erased by the state machine 4. If a microcomputer is designed to have this type of nonvolatile semiconductor storage device 9 and a CPU (central processing unit), the data in the block for which reading is prohibited cannot be read by the CPU.

SUMMARY OF THE INVENTION

According to a first aspect of the present invention, there is provided a semiconductor device including a first rewritable nonvolatile storage unit for storing data, and a second rewritable nonvolatile storage unit for holding security information that determines the feasibility (permission/prohibition) of outputting to the outside of the data from the first storage unit. The semiconductor device further includes a control processing unit for reading the stored data from the first storage unit by indicating a storage region in the first storage unit. A first path extends from the first storage unit to the control processing unit. The data read from the first storage unit is supplied to the control processing unit via the first path so that the control processing unit performs control processing on the basis of the data supplied via the first path. A second path extends to the outside from the first storage unit. The semiconductor device also includes an output controller provided in the second path for controlling output of the data read from the first storage unit to the outside, on the basis of the security information.

When a certain storage region in the first storage unit is specified by the control processing unit, the data (content) stored in that region of the first storage unit is read and supplied to the control processing unit via the first path. At the same time, the security information is read from the second storage unit and supplied to the output controller. If, according to the security information, the outputting of the data to the outside is permitted, the data retrieved from the first storage unit is output to the outside via the second path. If, according to the security information, the outputting of the data to the outside from the first storage unit is prohibited, the data read from the first storage unit is not outputted to the outside. Consequently, the outputting of the stored data to the outside can be controlled by the security information, and the control processing unit is capable of reading the stored data of the first storage unit without erasing the data stored in the first storage unit.

As described above, the semiconductor device includes the output controller for controlling the outputting of the stored data to the outside from the first storage unit on the basis of the security information held by the second storage unit. As a result, the stored data which is protected by the security setting does not leak to the outside and the stored data can be used in control processing by the control processing unit without the stored data being erased.

The first storage unit may include a plurality of storage blocks, and the second storage unit may hold the security information for the respective storage blocks of the first storage unit.

The semiconductor device may further include a first selector for selecting a first address signal and a first control signal which are both supplied from the outside when a test mode is set. The first selector selects a second address signal and a second control signal which are both supplied from the control processing unit when a normal mode is set. The first selector then supplies the selected address and control signals to the first and second storage units. The semiconductor device may also include a second selector for selecting write data which is supplied from the outside when the test mode is set, and for selecting output data of the control processing unit when the normal mode is set. The second selector supplies the selected data to the first storage unit.

Since the second storage unit holds the security information for the respective storage blocks of the first storage unit, security setting can be provided for the respective storage blocks. The first and second selection units directly connect the first storage unit to the outside at the time of the test mode. As a result, before the security setting is made, an operation test for the storage unit can be performed by using a test device.

According to a second aspect of the present invention, there is provided a semiconductor device including a first rewritable nonvolatile storage unit for storing data, the first storage unit including a plurality of storage blocks. The semiconductor device also includes a second rewritable nonvolatile storage unit for holding security information that determines permission/prohibition of outputting to the outside of the data stored in the respective storage blocks of the first storage unit. The semiconductor device also includes a control processing unit for reading the stored data from the first storage unit by indicating a certain storage block of the first storage unit. A first path extends to the control processing unit from the first storage unit so that the control processing unit performs control processing on the basis of the data transmitted from the certain storage block of the first storage unit via the first path. The control processing unit has a test function which, when a test signal requesting a boundary scan test is serially supplied from the outside, scans internal state information on the basis of the test signal and outputs this internal state information as serial data. The semiconductor device further includes a first selector for selecting a first address signal and a first control signal which are supplied from the outside when a memory test mode is instructed. The first selector selects a second address signal and a second control signal which are output by the control processing unit when a normal mode or boundary scan test is instructed. The first selector supplies the selected address signal and control signal to the first and second storage units. The semiconductor device further includes a second selector for selecting write data which is supplied from the outside when the memory test mode is instructed. The second selector selects output data of the control processing unit when the normal mode or boundary scan test is instructed. The second selector supplies the selected data to the first storage unit. The semiconductor device also includes a first data output controller provided in the first path for outputting the data retrieved from the first storage unit to the control processing unit irrespective of the security information when normal mode is instructed. The first data output controller controls output of the retrieved data to the control processing unit on the basis of the security information when a boundary scan test is instructed. A second path extends to the outside from the first storage unit. The semiconductor device also includes a second data output controller provided in the second path for controlling the retrieved data to the outside on the basis of the security information.

The first data output controller controls output to the control processing unit of the data read from the first storage unit when the boundary scan test is instructed, on the basis of security information held by the second storage unit. As a result, there is no risk of leakage of the stored data under the security setting during the boundary scan test.

DETAILED DESCRIPTION OF THE INVENTION

First Embodiment

Figure 1:
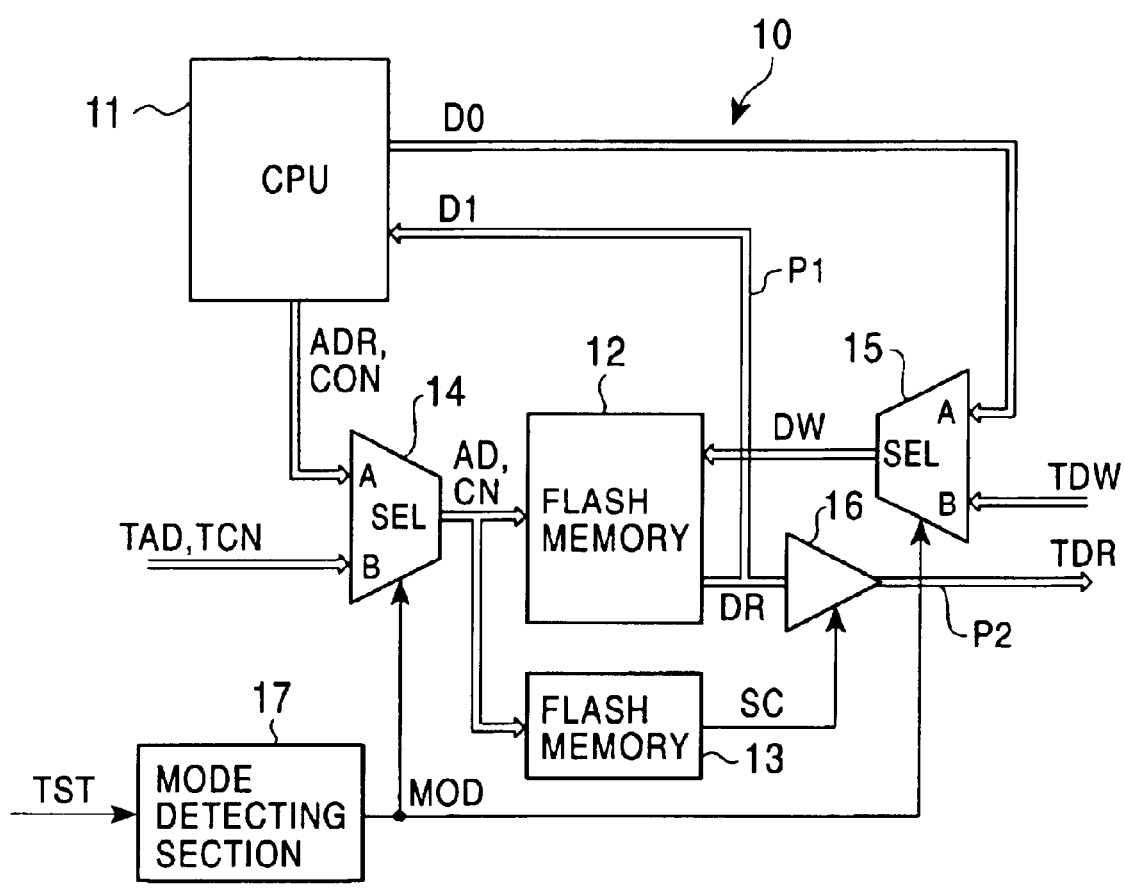
FIG. 1 illustrates a schematic structure of a semiconductor device according to a first embodiment of the present invention.
Figure 2:
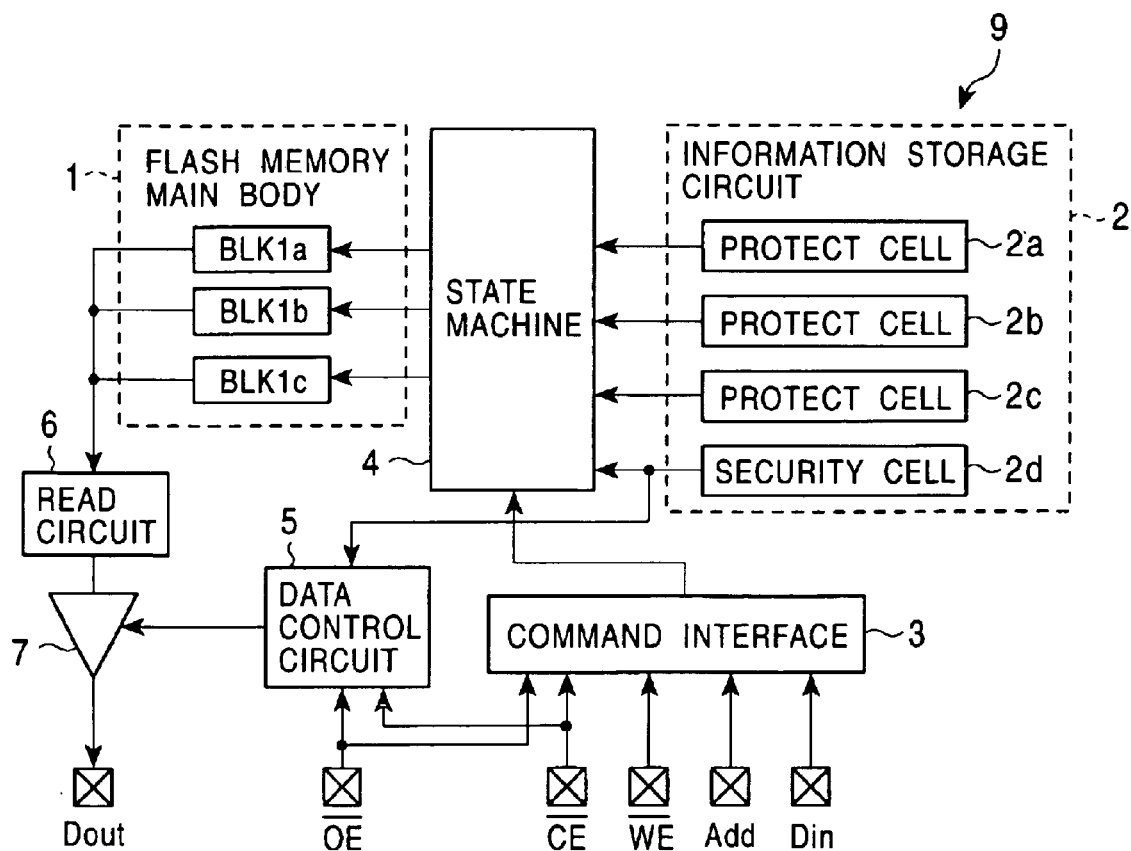
FIG. 2 illustrates a schematic structure of a conventional nonvolatile semiconductor storage device.

Referring to FIG. 1, a block diagram of a semiconductor device according to a first embodiment of the present invention is illustrated.

This semiconductor storage device 10 includes control processing means (CPU, for example) 11, and storage means (flash memories, for example) 12 and 13. The flash memories 12 and 13 are nonvolatile memories which permit electrical batch erasure and writing. The flash memory 12 includes a plurality of storage blocks for storing processing programs, data and so forth. The flash memory 13 is used for setting security condition that allows or prohibits reading of the stored data to the outside from the respective storage blocks of the flash memory 12.

An address signal ADR and a control signal CON which are issued from the CPU 11 are supplied to the input terminal A of selection means (selector (SEL), for example) 14, and a test address signal TAD and a test control signal TCN are supplied to the input terminal B of the selector 14 from the outside. The selector 14 selects the input terminal A when a normal mode (level "L", for example) is indicated by a mode signal MOD supplied to the control terminal and selects the input terminal B when a test mode (level "H", for example) is indicated by the mode signal MOD. Upon selection of the terminal A or B, the selector 14 outputs an address signal AD and a control signal CN. The address signal AD and the control signal CN are supplied to the flash memory 12. The control signal CN, and upper bits of the address signal AD which correspond with storage blocks of the flash memory 12 are then supplied to the flash memory 13.

Output data DO which is output by the CPU 11 is supplied to the input terminal A of a selector 15 and test write data TDW is supplied to the input terminal B of the selector 15 from the outside. Similarly to the selector 14, the selector 15 selects the input terminal A or B in accordance with the mode signal MOD supplied to the control terminal of the selector 15, and outputs write data DW. The write data DW is then supplied to the flash memory 12.

Read data DR which is read from the flash memory 12 is supplied directly to the CPU 11, as input data DI, via a path P1 and is also supplied to the outside, as test read data TDR, via a path P2. An output means (tri-state buffer, for example) 16 is provided in the path P2. The output of the tri-state buffer 16 is controlled by a security signal SC supplied from the flash memory 13. When the security is OFF (when the security signal SC is "H", for example), the read data TDR is output from the tri-state buffer 16. When the security is ON (when the security signal SC is "L", for example), the output side of the tri-state buffer 16 has a high impedance.

The semiconductor device 10 includes a mode detector 17 that detects a test signal TST supplied from the outside. The mode detector 17 sets the mode signal MOD to the test mode when the mode detector 17 detects that the test is requested by the test signal TST. The mode detector 17 sets the mode signal MOD to the normal mode when the mode detector 17 detects that the test state is not requested by the test signal TST. The mode detector 17 then supplies this mode signal MOD to the selectors 14 and 15.

The operation of the semiconductor device 10 will be described next.

When the operation test of the flash memory 12 is performed, the flash memories 12 and 13 are first batch-erased by an erase circuit (not shown). As a result, all the memory cells of the flash memories 12 and 13 are set to the "H" state.

Subsequently, the semiconductor device 10 is connected to a test device and the test state is set by the test signal TST from the outside. Accordingly, the mode signal MOD becomes the test mode signal, and the input terminals B are selected at the selectors 14 and 15, respectively. The test address signal TAD and the test control signal TCN are supplied to the flash memory 12 together with the test write data TDW. Because all of the security signals SC supplied from the flash memory 13 are "H", the read data DR of the flash memory 12 is output to the outside as the test read data TDR via the tri-state buffer 16.

After that, a predetermined test pattern is written to the flash memory 12 by the test device, and a test of whether normal (proper) reading and writing is feasible is performed by retrieving the test pattern thus written.

Predetermined programs and data are written to the flash memory 12 if the test operation shows that the flash memory 12 functions properly. In order to set the security signal SC, which is applied to a region from which reading of the data to the outside is prohibited, to "L", "L" data is written to the corresponding bits of the flash memory 13.

During the normal operation, the test signal TST is no longer applied, and the mode signal MOD becomes the normal mode signal. As a result, the input terminals A are selected at the selectors 14 and 15, respectively, and the address signal ADR and control signal CON from the CPU 11 are supplied, together with the output data DO, to the flash memory 12. The read data DR of the flash memory 12 is supplied to the CPU 11 as input data DI. The outputting of the read data DR to the outside is controlled in accordance with the security signal SC which is produced based on security information set in the flash memory 13.

As described above, the semiconductor device 10 of the first embodiment includes the path for passing the read data DR of the flash memory 12 to the CPU 11 as the input data DI. Consequently, even if retrieval of the stored data to the outside is prohibited by the security signal SC, the CPU 11 is capable of reading the data from the flash memory 12 without causing deletion of the data stored in the flash memory 12.

Second Embodiment

Figure 3:
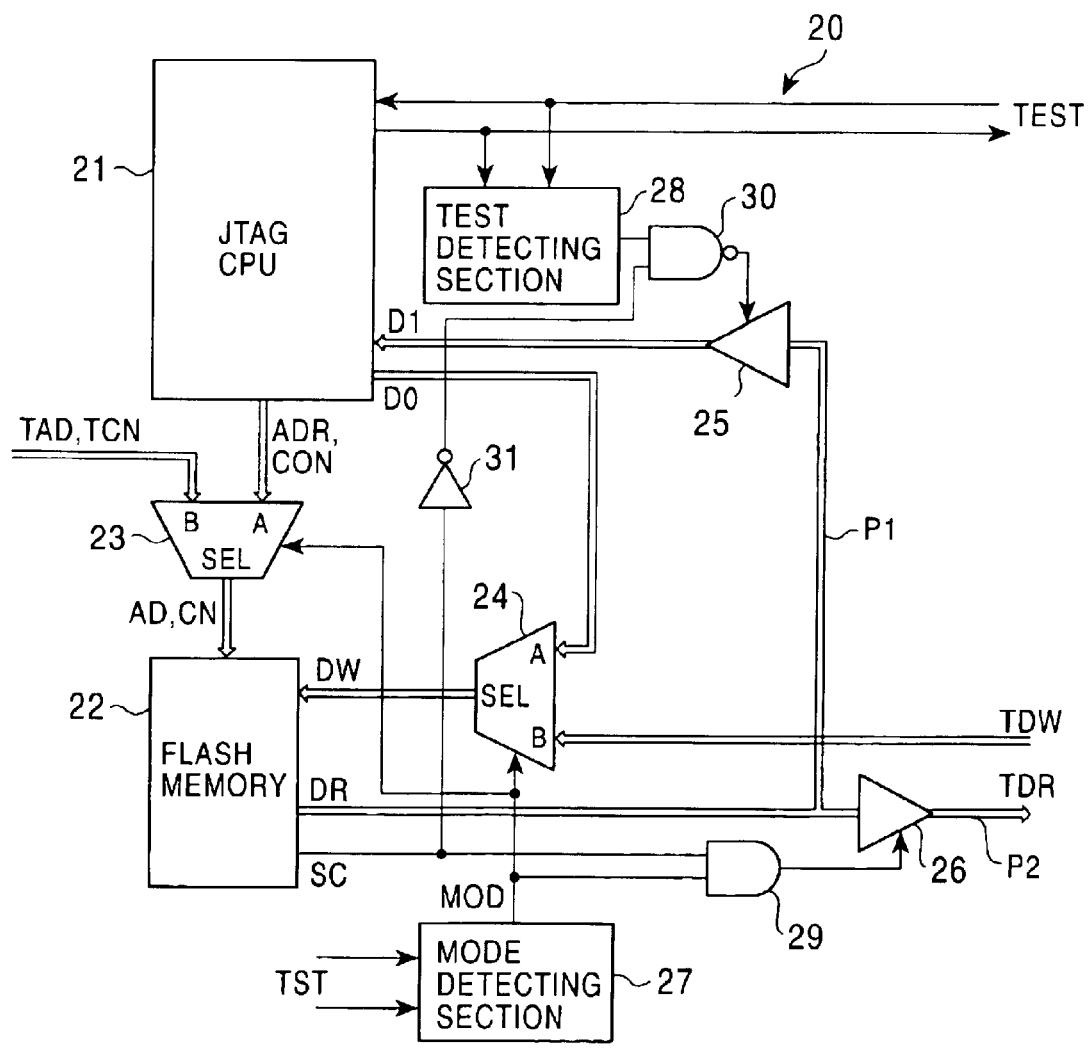
FIG. 3 illustrates a schematic structure of a semiconductor device according to a second embodiment of the present invention.

Referring to FIG. 3, a semiconductor device of the second embodiment of the present invention will be described.

This semiconductor device 20 includes a CPU equipped with a boundary scan test function (JTAG CPU) 21, and a flash memory 22 for storing processing programs and data and so forth.

The CPU 21 has a JTAG (Joint Test Action Group) scan test function, and includes terminals (ports) for serially inputting and outputting a test signal TEST in addition to terminals for inputting and outputting signals required for the ordinary operation of the CPU 21.

The address signal ADR and control signal CON which are outputted by the CPU 21 are supplied to the input terminal A of a selector 23. The test address signal TAD and test control signal TCN are supplied from the outside to the input terminal B of the selector 23. The selector 23 selects the input terminal A when the normal mode is designated by the mode signal MOD supplied to the control terminal of the selector 23, and selects the input terminal B when the test mode is designated by the mode signal MOD. The selector 23 thus outputs the selected address signal AD and control signal CN to the flash memory 22.

Output data DO from the CPU 21 is supplied to the input terminal A of a selector 24 and test write data TDW is supplied from the outside to the input terminal B of the selector 24. Similar to the selector 23, the selector 24 selects the input terminal A or B in accordance with the mode signal MOD supplied to the control terminal of the selector 24, and outputs write data DW to the flash memory 22.

Read data DR from the flash memory 22 is supplied to the CPU 21 as the input data DI via a tri-state buffer 25 provided in the path P1. The read data DR is also supplied to the outside as test read data TDR via a tri-state buffer 26 provided in the path P2.

The semiconductor device 20 also includes a mode detector 27 which detects the test signal TST supplied from the outside and outputs the mode signal MOD in accordance with the operation state designated by the test signal TST, and a test detector 28 which determines whether the test mode is requested on the basis of a JTAG test signal TEST supplied from the outside. The normal mode is set by the mode detector 27 during normal operation and during a boundary scan test operation. A memory test mode is set by the mode detector 27 when the flash memory 22 is tested from the outside by using the test write data TDW and test read data TDR.

The mode signal MOD from the mode detector 27 is introduced to the control terminals of the selectors 23 and 24 and also to the first input of a dual-input AND gate 29. The security signal SC is supplied from the flash memory 22 to the second input of the AND gate 29, and the output of the tri-state buffer 26 is controlled by the output signal of the AND gate 29.

The output signal of the test detector 28 is fed to the first input of a dual-input NAND gate 30. The security signal SC is supplied from the flash memory 22 to the second input of the NAND gate 30 after being inverted by an inverter 31. The output of the tri-state buffer 25 is controlled by the signal supplied to the tri-state buffer 25 from the NAND gate 30.

Figure 4:
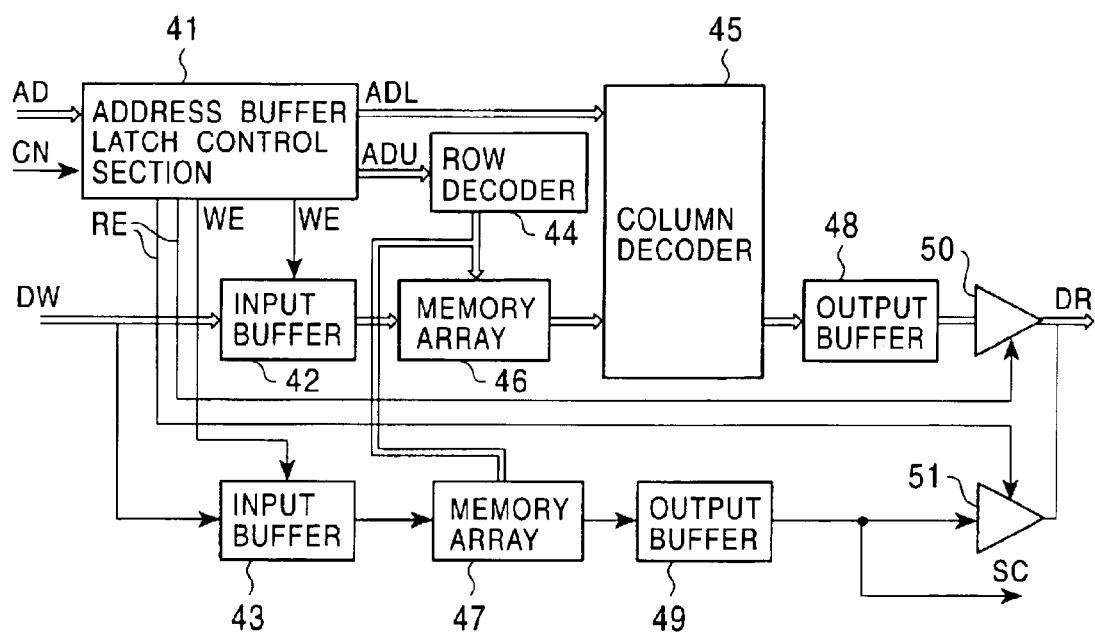
FIG. 4 illustrates a block diagram of a flash memory shown in FIG. 3.

FIG. 4 illustrates the detail of an exemplary structure of the flash memory 22 shown in FIG. 3.

The flash memory 22 includes an address buffer latch controller 41. The address signal AD and the control signal CN are supplied to the address buffer latch controller 41 from the selector 23. The flash memory 22 also includes two input buffers 42 and 43. The write data DW is supplied to the flash memory 22 from the selector 24.

The address buffer latch controller 41 holds the address signal AD and divides the address signal into an upper address ADU and a lower address ADL. The upper and lower addresses ADU and ADL are introduced into a row decoder 44 and a column decoder 45. The address buffer latch controller 41 also outputs, on the basis of the control signal CN, write control signals WE to the input buffers 42 and 43, and read control signals RE to tri-state buffers 50 and 51. The write control signals WE control the writing of data into the input buffers 42 and 43. The read control signals RE control the outputting of the read data DR.

Memory arrays 46 and 47 are connected to the outputs of the input buffers 42 and 43, respectively. Each of the memory arrays 46 and 47 has a matrix of nonvolatile memory cells which permit electrical batch erasure and writing of the data. The memory array 46 is used to store processing programs and data and so forth. The matrix of memory cells in the memory array 46 are divided into a plurality of blocks. The memory array 47 is used to set security information (to establish a security condition) that determines permission or prohibition of reading of the data to the outside. The permission or prohibition of the data retrieval is determined for each of the blocks of the memory array 46. A signal from the row decoder 44 which indicates the read/write region is supplied to each of the memory arrays 46 and 47.

The output of the memory array 46 is connected to the column decoder 45 so that data corresponding to the lower address ADL is selected by the column decoder 45 and supplied to an output buffer 48. The output of the memory array 47 is coupled to an output buffer 49. The output signals of the output buffers 48 and 49 are supplied to the outside as read data DR via the tri-state buffers 50 and 51 which are controlled by the read control signals RE from the address buffer latch controller 41. Also, the output signal of the output buffer 49 is issued as the security signal SC.

The operation of the semiconductor device 20 will be described next.

When a memory test for the flash memory 22 is performed, the memory arrays 46 and 47 in the flash memory 22 are first batch-erased by an erase circuit (not shown). As a result, all the memory cells of the memory arrays 46 and 47 are set to the "H" state.

The semiconductor device 20 is connected to a test device (not shown) and a test state is set by the test signal TST from the outside. Accordingly, the mode signal MOD becomes the memory test mode ("H", for example) and the input terminals B are selected at the selectors 23 and 24. Thus, the test address signal TAD and test control signal TCN are supplied together with the test write data TDW to the flash memory 22. Since the security signal SC issued from the memory array 47 is an "H" signal, the output signal of the AND gate 29 is an "H" signal, and the read data DR of the flash memory 22 is output to the outside, as the test read data TDR, via the tri-state buffer 26.

In this state, a predetermined test pattern is written to the flash memory 22 from the test device and a test of whether normal (proper) reading and writing is feasible is performed by retrieving the test pattern thus written. Predetermined programs and data are written to the memory array 46 if the memory test shows that the memory array 46 functions properly. In order to set the security condition to a region from which reading of the data to the outside is prohibited, "L" data is written to the corresponding bits of the memory array 47.

Next, a boundary scan test is performed. When a boundary scan test mode is designated by the test signal TST during the boundary scan test, an "L" mode signal MOD is generated by the mode detector 27. This is the same as the normal mode. As a result, the input terminals A are selected at the selectors 23 and 24, and the address signal ADR and control signal CON are supplied, together with the output data DO, to the flash memory 22 from the CPU 21. The read data DR of the flash memory 22 is supplied to the CPU 21 as the input data DI via the tri-state buffer 25. The tri-state buffer 25 is controlled by the security signal SC and the detection signal of the test detector 28. Since the mode signal MOD is an "L" signal, the output signal of the AND gate 29 is an "L" signal. At the same time, the tri-state buffer 26 has a high impedance and the output of the test read data TDR to the outside is stopped.

In this state, when the test signal TEST for performing a boundary scan test is serially input to the CPU 21, the test state (request for test) is detected by the test detector 28 and the output signal of the test detector 28 becomes a "H" signal.

As a result of the execution of the boundary scan test, the flash memory 22 is accessed. As the flash memory 22 is accessed, the security signal SC of the accessed region is output from the flash memory 22. When reading of the data from the accessed region is prohibited, the security signal SC is an "L" signal. If the security signal SC is the "L" signal in this instance, the output signal of the NAND gate 30 is an "L" signal and the read data DR of the flash memory 22 is not supplied to the CPU 21. If, on the other hand, reading of the data from the accessed region is not prohibited, the security signal SC is an "H" signal and therefore the output signal of the NAND gate 30 is an "H" signal. Accordingly, the read data DR of the flash memory 22 is supplied to the CPU 21 as the input data DI.

When normal operation mode is indicated by the test signal TST during normal operation, an "L" mode signal MOD is output by the mode detector 27. As a result, the input terminals A are selected by the selectors 23 and 24, and the address signal ADR and control signal CON are supplied together with the output data DO to the flash memory 22 from the CPU 21. Because the boundary scan test mode is not detected by the test detector 28, the output signal of the test detector 28 is "L" and the output signal of the NAND gate 30 is "H" irrespective of the security signal SC. Accordingly, the read data DR of the flash memory 22 is supplied to the CPU 21 as the input data DI via the tri-state buffer 25. Because the mode signal MOD is "L", the tri-state buffer 26 is subject to high impedance and the outputting of the read data DR to the outside is permitted.

As described above, the semiconductor device 20 of the second embodiment includes the tri-state buffer 25 for determining whether, on the basis of security information which is set for the flash memory 22, the read data DR of the flash memory 22 should be supplied as the input data DI to the CPU 21 during the boundary scan test. Accordingly, in addition to benefits like those for the first embodiment, there is additional benefit that, even if the CPU 21 has a boundary scan test function, there is no risk of data retrieval to the outside from the flash memory 22 as long as the security setting is done for the flash memory 22.

It should be noted that the present invention is not limited to or by the above described embodiments. Various changes and modifications may be made to the described and illustrated embodiments by those skilled in the art without departing from the scope of the present invention. Modified embodiments include the following, for example.

The logic circuitry for controlling the tri-state buffers 25 and 26 in FIG. 3 is not limited to the described circuitry. Any suitable circuitry can be used as long as the replacement circuitry permits the same control.

In the described embodiment, the address buffer latch control unit 41 in FIG. 4 holds the address signal AD, divides the address signal AD into the upper address ADU and the lower address ADL, and supplies the write control signal and read control signal on the basis of the control signal CN. However, the control unit 41 may also have a function for compulsorily erasing the data in a region upon accessing that region if that region is a read-prohibited region.

What is claimed is:

1. A semiconductor device comprising:
a first rewritable nonvolatile storage unit for storing data;
a second rewritable nonvolatile storage unit for holding security information that determines permission or prohibition of outputting to outside of the data stored in the first storage unit;
a first controller for specifying a storage region in the first storage unit to read the stored data from the specified storage region in the first storage unit;
a first path extending to the first controller from the first storage unit for transmitting the data from the specified storage region of the first storage unit to the first controller, thereby allowing the first controller to perform control processing based on the data transmitted via the first path;

a second path extending to the outside from the first storage unit; and a second controller provided in the second path for controlling outputting of the data to the outside from the specified storage region of the first storage unit based on the security information.

2. The semiconductor device according to claim 1, wherein the first storage unit comprises a plurality of storage blocks to store the data, and the second storage unit holds the security information for the respective storage blocks of the first storage unit.

3. The semiconductor device according to claim 1 further comprising:

a first selector for selecting a first address signal and a first control signal which are both supplied from the outside when a test mode is set and for selecting a second address signal and a second control signal which are both supplied from the first controller when a normal mode is set, thereby supplying the selected address signal and control signal to the first and second storage units; and a second selector for selecting write data supplied from the outside when the test mode is set and for selecting output data supplied from the first controller when the normal mode is set, thereby supplying the selected data to the first storage unit.

4. The semiconductor device according to claim 1, wherein the first storage unit is a first flash memory, and the second storage unit is a second flash memory.

5. The semiconductor device according to claim 1, wherein the second controller is a tri-state buffer.

6. A semiconductor device comprising:

a first rewritable nonvolatile storage unit for storing data, the first storage unit including a plurality of storage blocks;

a second rewritable nonvolatile storage unit for holding security information that determines permission or prohibition of outputting to outside of the data stored in the respective storage blocks of the first storage unit;

a control processing unit for reading the data from a designated one of the plurality of storage blocks of the first storage unit, the control processing unit having a test function so that the control processing unit scans internal state information based on a test signal when the test signal instructs a boundary scan test and the test signal is serially supplied to the control processing unit from the outside, and then the control processing unit outputs the internal state information as serial data;

a first path extending to the control processing unit from the first storage unit for transmitting the data to the control processing unit from the designated storage block of the first storage unit to the control processing unit, thereby allowing the control processing unit to perform control processing based on the data supplied via the first path;

a first selector for selecting a first address signal and a first control signal which are supplied from the outside when a memory test mode is instructed to the first selector, and for selecting a second address signal and a second control signal which are supplied from the control processing unit when a normal mode or boundary scan test is instructed to the first selector, thereby supplying the selected address and control signals to the first and second storage units;

a second selector for selecting write data which is supplied from the outside when the memory test mode is instructed to the second selector and for selecting output data which is supplied from the control processing unit when the normal mode or boundary scan test is instructed to the second selector, thereby supplying the selected data to the first storage unit;

a first data output controller provided in the first path for outputting the data read from the designated storage block of the first storage unit to the control processing unit irrespective of the security setting on the designated storage block when the normal mode is instructed, and for controlling outputting of the data to the control processing unit from the designated storage block of the first storage unit based on the security setting on the designated storage block when a boundary scan test is instructed;

a second path extending to the outside from the first storage unit; and a second data output controller provided in the second path for controlling of outputting of the data from the designated storage block of the first storage unit to the outside based on the security setting on the designated storage block.

7. The semiconductor device according to claim 6, wherein the first storage unit is a first array of memory cells, and the second storage unit is a second array of memory cells.

8. The semiconductor device according to claim 6, wherein the first data output controller is a first tri-state buffer and the second data output controller is a second tri-state buffer.

9. A semiconductor device comprising:

first rewritable nonvolatile storage means for storing data;

second rewritable nonvolatile storage means for holding security information that determines feasibility of outputting to outside of the data stored in the first storage means;

control processing means for specifying a storage region in the first storage means to read the stored data from the specified storage region in the first storage means;

a first path extending to the control processing means from the first storage means for transmitting the data from the specified storage region of the first storage means to the control processing means, thereby allowing the control processing means to perform control processing based on the data transmitted via the first path;

a second path extending to the outside from the first storage means; and output means provided in the second path for controlling outputting of the data to the outside from the specified storage region of the first storage means based on the security information.

10. The semiconductor device according to claim 9, wherein the first storage means comprises a plurality of storage blocks to store the data, and the second storage means holds the security information for the respective storage blocks of the first storage means.

11. The semiconductor device according to claim 9 further comprising:

first selection means for selecting a first address signal and a first control signal which are both supplied from the outside when a test mode is set and for selecting a second address signal and a second control signal which are both supplied from the control processing means when a normal mode is set, thereby supplying the selected address signal and control signal to the first and second storage means; and second selection means for selecting write data which is supplied from the outside when the test mode is set and for selecting output data which is supplied from the control processing means when the normal mode is set, thereby supplying the selected data to the first storage means.

12. The semiconductor device according to claim 9, wherein the first storage means is a first flash memory, and the second storage means is a second flash memory.

13. The semiconductor device according to claim 9, wherein the output means is a tri-state buffer.

* * * * *